(12) United States Patent
Sakai et al.

(10) Patent No.: US 8,598,047 B2
(45) Date of Patent: Dec. 3, 2013

(54) SUBSTRATE PROCESSING APPARATUS AND PRODUCING METHOD OF SEMICONDUCTOR DEVICE

(75) Inventors: Masanori Sakai, Takaoka (JP); Toru Kagaya, Toyoma (JP); Hirohisa Yamazaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/270,811

(22) Filed: Oct. 11, 2011

(65) Prior Publication Data
US 2012/0034788 A1 Feb. 9, 2012

Related U.S. Application Data

(60) Continuation of application No. 12/414,128, filed on Mar. 30, 2009, now abandoned, which is a division of application No. 10/549,698, filed as application No. PCT/JP2004/009820 on Jul. 9, 2004, now abandoned.

(30) Foreign Application Priority Data

Aug. 15, 2003 (JP) .................. 2003-293953

(51) Int. Cl.
*H01L 21/31* (2006.01)
(52) U.S. Cl.
USPC ...................... 438/758; 27/E21.24
(58) Field of Classification Search
USPC .......................................... 118/715
See application file for complete search history.

(56) References Cited

U.S. PATENT DOCUMENTS

| | | | |
|---|---|---|---|
| 4,529,474 A | 7/1985 | Fujiyama et al. | |
| 4,699,805 A | 10/1987 | Seelbach et al. | |
| 5,252,133 A | 10/1993 | Miyazaki et al. | |
| 5,484,484 A | 1/1996 | Yamaga et al. | |
| 5,709,757 A | 1/1998 | Hatano et al. | |
| RE36,328 E | 10/1999 | Miyashita et al. | |
| 6,074,486 A | 6/2000 | Yang et al. | |
| 6,146,461 A | 11/2000 | Yang et al. | |
| 6,238,488 B1 * | 5/2001 | Fujita et al. ..................... | 134/18 |
| 2001/0024387 A1 | 9/2001 | Raaijmakers et al. | |
| 2001/0050054 A1 | 12/2001 | Kwag et al. | |
| 2003/0000473 A1 | 1/2003 | Chae et al. | |
| 2003/0024477 A1 * | 2/2003 | Okuda et al. ............. | 118/723 IR |
| 2003/0049372 A1 | 3/2003 | Cook et al. | |
| 2003/0213435 A1 | 11/2003 | Okuda et al. | |

FOREIGN PATENT DOCUMENTS

| | | |
|---|---|---|
| JP | 1296613 A | 11/1989 |
| JP | 2267197 A | 10/1990 |
| JP | 2000-212752 | 8/2000 |
| JP | 2002-164345 | 6/2002 |
| JP | 2003-347298 | 12/2003 |
| JP | 2004-023043 | 1/2004 |
| JP | 2004-124193 | 4/2004 |
| JP | 2004-288899 | 10/2004 |

* cited by examiner

*Primary Examiner* — Allan Olsen
(74) *Attorney, Agent, or Firm* — Birch, Stewart, Kolasch & Birch, LLP

(57) ABSTRACT

A substrate treatment apparatus includes a reaction tube and a heater heating a silicon wafer. Trimethyl aluminum (TMA) and ozone ($O_3$) are alternately fed into the reaction tube to generate $Al_2O_3$ film on the surface of the wafer. The apparatus also includes supply tubes and for flowing the ozone and TMA and a nozzle supplying gas into the reaction tube. The two supply tubes are connected to the nozzle disposed inside the heater in a zone inside the reaction tube where a temperature is lower than a temperature near the wafer, and the ozone and TMA are supplied into the reaction tube through the nozzle.

9 Claims, 5 Drawing Sheets

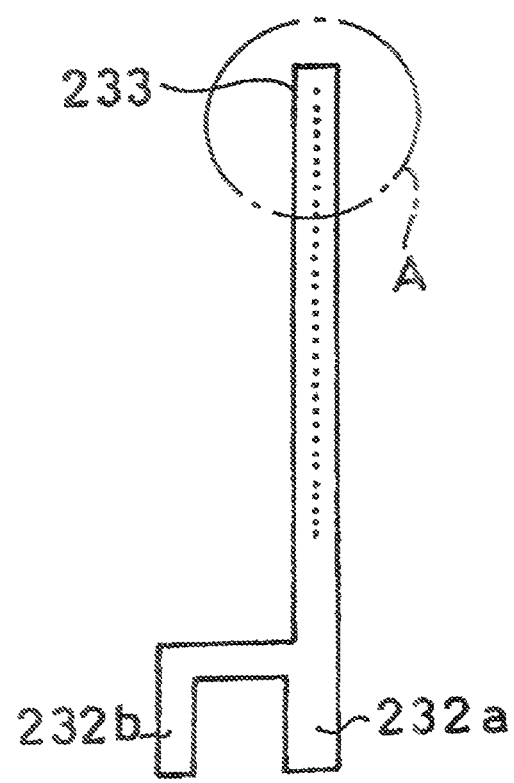

SUBSTRATE PROCESSING APPARATUS AND PRODUCING METHOD OF SEMICONDUCTOR DEVICE

This application is a Continuation of application Ser. No. 12/414,128 filed Mar. 30, 2009 now abandoned which is a Divisional of application Ser. No. 10/549,698 filed on Jul. 14, 2006 now abandoned and for which priority is claimed under 35 U.S.C. §120. Application Ser. No. 10/549,698 is the national phase of PCT International Application No. PCT/JP2004/009820 filed on Jul. 9, 2004 under 35 U.S.C. §371, which claims priority to JP 2003-293953 filed in Japan Aug. 15, 2003. The entire contents of each of the above-identified applications are hereby incorporated by reference.

TECHNICAL FIELD

The present invention relates to a substrate processing apparatus and a producing method of a semiconductor device, and more particularly, to a semiconductor producing apparatus which forms a film by ALD (Atomic layer Deposition) method used when an Si semiconductor device is produced, and to a producing method of a semiconductor device by the ALD method.

BACKGROUND ART

A film forming processing using the ALD method which is one of CVD (Chemical Vapor Deposition) methods will be explained briefly.

The ALD method is a method in which two (or more) kinds of raw material gases used for forming a film are alternately supplied onto a substrate by one kind by one kind under certain film forming conditions (temperature, time and the like), the gases are allowed to be adsorbed by one atomic layer by one atomic layer, and a film is formed utilizing a surface reaction.

That is, when an $Al_2O_3$ (aluminum oxide) film is to be produced for example, a high quality film can be formed at a low temperature as low as 250 to 450° C. by alternately supplying TMA ($Al(CH_3)_3$, trimethyl aluminum) and $O_3$ (ozone) using the ALD method. In the ALD method, a film is formed by supplying a plurality of reaction gases alternately one kind by one kind in this manner. The thickness of the film is controlled by the number of cycles of the supply of the reaction gases. For example, when film forming speed is 1 Å/cycle in order to form a film of 20 Å, 20 cycles of the film forming processing are carried out.

A conventional ALD apparatus which forms the $Al_2O_3$ film is called a single wafer type apparatus in which the number of substrates to be processed in one processing furnace at a time is one to five, and an apparatus called a batch type apparatus in which 25 or more substrates are arranged in parallel to an axial direction of a reaction tube has not yet become commercially practical.

When an $Al_2O_3$ film is formed by such a vertical hatch type apparatus using TMA and $O_3$, if a TMA nozzle and an $O_3$ nozzle separately disposed vertically in the reaction furnace, there is an adverse possibility that TMA is decompose in the TMA gas nozzle and Al (aluminum) film is formed and if the film becomes thick, it is peeled off and becomes a foreign matter generating source.

It is a main object of the present invention to provide a substrate processing apparatus and a producing method of a semiconductor device capable of suppressing the generation of foreign matter caused by peel by preventing a film from being produced in a nozzle.

DISCLOSURE OF THE INVENTION

According to one aspect of the present invention, there is provided a substrate processing apparatus having a processing chamber which accommodates a substrate or substrates therein, and a heating member which heats said substrate or substrates, in which at least two gases which react with each other are alternately supplied into said processing chamber to form a desired film or films on a surface or surfaces of said substrate or substrates, characterized by comprising:

two supply tubes through which said two gases respectively flow independently from each other; and a single gas supply member which supplies said gases into said processing chamber and which has a portion extending to a region whose temperature is equal to or higher than a decomposition temperature of at least one of said two gases, wherein said two supply tubes are connected to said gas supply member at a location whose temperature is lower than the decomposition temperature of said at least one gas, and said two gases are supplied into said processing chamber through said gas supply member.

According to another aspect of the present invention, there is provided a substrate processing apparatus comprising a hot wall type processing furnace which includes a processing chamber which accommodates a substrate or substrates therein and a heating member which is disposed outside of said processing chamber and which heats said substrate or substrates, wherein at least two gases which react with each other are alternately supplied into said processing chamber to produce a desired film or films on a surface or surfaces of said substrate or substrates, characterized by comprising:

two supply tubes through which said two gases respectively flow independently from each other; and a single gas supply member which supplies said gases into said processing chamber, and which has a portion disposed inside of said heating member, wherein said two supply tubes are connected to said gas supply member in a region whose temperature is lower than a temperature in said processing chamber in the vicinity of said substrate or substrates, and said two gases are supplied into said processing chamber through said gas supply member.

According to still another preferable aspect of the present invention, there is provided a semiconductor device producing method characterized in that using a substrate processing apparatus having a processing chamber which accommodates a substrate or substrates therein, and a heating member which heats said substrate or substrates, in which at least two gases which react with each other are alternately supplied into said processing chamber to form a desired film or films on a surface or surfaces of said substrate or substrates, comprising:

two supply tubes through which said two gases respectively flow independently from each other; and a single gas supply member which supplies said gases into said processing chamber and which has a portion extending to a region whose temperature is equal to or higher than a decomposition temperature of at least one of said two gases, wherein said two supply tubes are connected to said gas supply member at a location whose temperature is lower than the decomposition temperature of said at least one gas, and said two gases are supplied into said processing chamber through said gas supply member.

said two gases are alternately supplied into said processing chamber through said gas supply member to form said desired film or films on said surface or surfaces of said substrate or substrates.

BRIEF DESCRIPTION OF THE FIGURES IN THE DRAWINGS

FIG. 3A is a schematic diagram for explaining a nozzle 233 of the vertical substrate processing furnace of the substrate processing apparatus according to the one embodiment of the present invention.

PREFERABLE MODE FOR CARRYING OUT THE INVENTION

Figure 1:
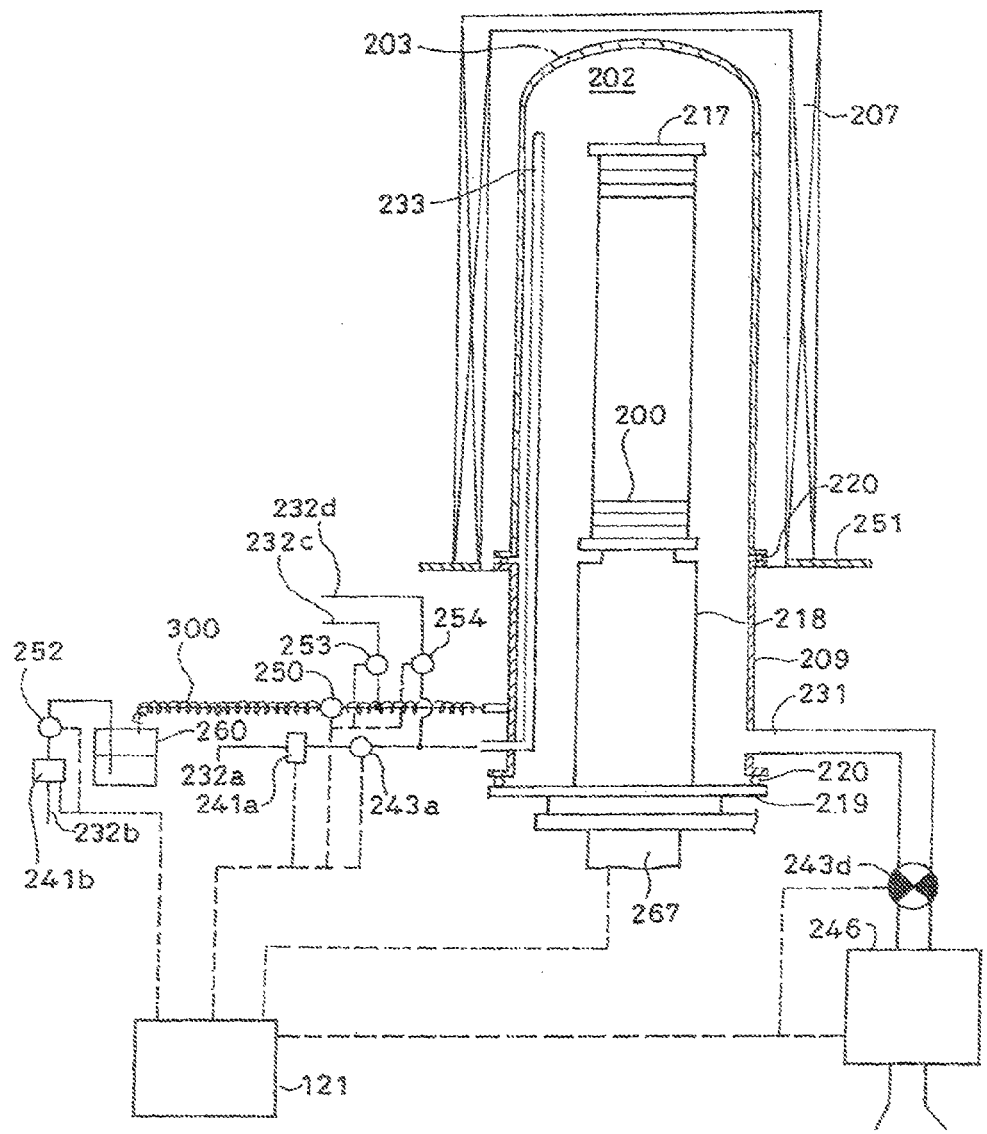
FIG. 1 is a schematic longitudinal sectional view of a vertical substrate processing furnace of a substrate processing apparatus according to one embodiment of the present invention.

In a batch type processing apparatus according to a preferred embodiment of the present invention, trimethyl aluminum (chemical formula: $Al(CH_3)_3$, TMA) and ozone ($O_3$) are used as raw materials, the processing apparatus includes a substrate holding jig capable of holding a plurality of substrates, a reaction tube in which the substrate holding jig is inserted and which processes the substrates, heating means which heats the substrates, an evacuator capable of exhausting gas in the reaction tube, and one gas nozzle from which gas is issued toward the substrates in parallel to surfaces thereof, TMA and $O_3$ gas supply lines connected to the nozzle are merge with each other in a reaction chamber. TMA and $O_3$ are alternately supplied onto the substrates, thereby forming aluminum oxide films ($Al_2O_3$ films). Here, TMA is adsorbed on the substrate. $O_3$ gas which flows next reacts with the adsorbed TMA, and $Al_2O_3$ film of one atomic layer is produced.

If the pressure and the temperature of TMA are increased, self decomposition of TMA is prone to take place, and Al film is produced. The gas nozzle is provided with a nozzle hole from which gas is issued. Since the nozzle hole is small, the pressure in the nozzle becomes higher than the pressure in the furnace. When the pressure in the furnace is 0.5 Torr (about 67 Pa), it is expected that the pressure in the nozzle becomes 10 Torr (about 1330 Pa). Therefore, especially in a nozzle located in a high temperature region, the self decomposition of TMA is prone to take place. On the other hand, although the temperature in the furnace is high, the pressure in the furnace does not become as high as that in the nozzle and thus, the self decomposition of TMA is less prone to take place. Therefore, a problem of generation of Al film in the nozzle becomes serious.

To remove $Al_2O_3$ film adhered to an inner wall of the reaction tube, $ClF_3$ gas is allowed to flow to carry out cleaning. If this cleaning gas is supplied from the nozzle, $Al_2O_3$ film in the nozzle can also be removed at the same time, and the cleaning operation is facilitated and efficiency thereof is also be enhanced.

The present invention is suitably applied not only to a forming operation of $Al_2O_3$ films but also to a forming operation of $HfO_2$ films. This is because that Hf raw material causes the same problem as that of TMA. In this case, In this case. $O_3$ gas and Hf raw material gas of vaporized tetrakis (N-ethyl-N-methyl amino) hafnium (liquid at normal temperature) are allowed to flow alternately to form $HfO_2$ film.

The present invention is also suitably applied to a forming operation of $SiO_2$ films using the following materials:
(1) a case in which $O_3$ and $Si_2Cl_6$ (hexachloro disilane) are allowed to flow alternately to form $SiO_2$ films by the ALD method;
(2) a case in which $O_3$ and $(OC_2H_5)_3$(TRIES) are allowed to flow alternately to form $SiO_2$ films by the ALD method; and
(3) a case in which $O_3$ and $HSi[N(CH_3)_2]_3$(TrisDMAS) are allowed to flow alternately to form $SiO_2$ films by the ALD method.

Embodiment 1

Figure 2:
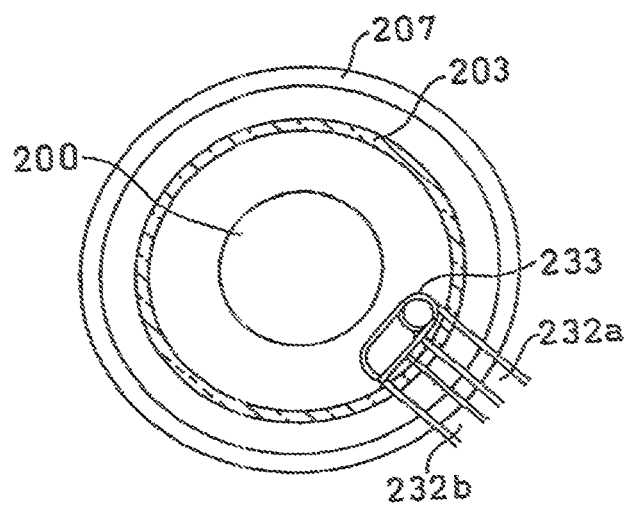
FIG. 2 is a schematic transversal sectional view of the vertical substrate processing furnace of the substrate processing apparatus according to the one embodiment of the present invention.
Figure 3B:
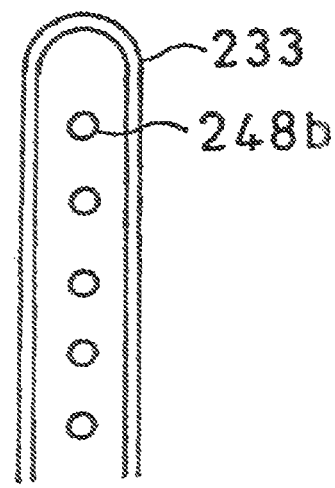
FIG. 3B is a partial enlarged diagram of a portion A in FIG. 3A.

FIG. 1 is a schematic diagram showing a structure of a vertical substrate processing furnace according to an embodiment, and is a vertical sectional view of a processing furnace portion, and FIG. 2 is a schematic diagram showing a structure of the vertical substrate processing furnace, and is a transverse sectional view of the processing furnace portion. FIG. 3A is a schematic diagram used for explaining a nozzle 233 of the vertical substrate processing furnace of a semiconductor producing apparatus of the embodiment, and FIG. 3B is a partial enlarged diagram of a portion A in FIG. 3A.

A reaction tube 203 as a reaction container is provided inside of a heater 207 which is heating means. The reaction tube 203 processes wafers 200 which are substrates. A manifold 209 made of stainless steel for example is engaged with a lower end of the reaction tube 203. A lower end opening of the manifold 209 is air-tightly closed with a seal cap 219 which is a lid through an O-ring 220 which is a hermetic member. At least the heater 207, the reaction tube 203, the manifold 209 and the seal cap 219 form a processing furnace 202. The manifold 209 is fixed to holding means (heater base 251, hereinafter).

A lower end of the reaction tube 203 and an upper opening end of the manifold 209 are provided with annular flanges, respectively. A hermetic member (O-ring 220, hereinafter) is disposed between the flanges to air-tightly seal between them.

A boat 217 which is substrate holding means is vertically provided above the seal cap 219 through a quartz cap 218. The quartz cap 218 is a holding body which holds the boat 217. The boat 217 is inserted into a processing furnace 202. The plurality of wafers 200 to be batch-processed are multi-stacked on the boat 217 in their horizontal attitudes in an axial direction of the boat 217. The heater 207 heats the wafers 200 inserted into the processing furnace 202 to a predetermined temperature.

The processing furnace 202 is provided with two gas supply tubes 232a and 232b as supply tubes which supply a plurality of (two, in this embodiment) kinds of gases to the processing furnace 202. The gas supply tubes 232a and 232b penetrate a lower portion of the manifold 209, merges with the gas supply tube 232a in the processing furnace 202, and, as shown in FIG. 3A, the two gas supply tubes 232a and 232b are brought into communication with one porous nozzle 233. The nozzle 233 is provided in the processing furnace 202, and its upper portion extends to a region whose temperature is equal to or higher than the decomposition temperature of TMA supplied from the gas supply tube 232b. However, a location where the gas supply tube 232h merges with the gas supply tube 232a in the processing furnace 202 is a region whose temperature is lower than the decomposition temperature of TMA, and the temperature of this region is lower than a temperature of the wafers 200 and a temperature in the vicinity of the wafers 200. Here, reaction gas ($O_3$) is supplied from the first gas supply tube 232a into the processing furnace 202 through a first mass flow controller 241a which is flow rate control means, a first valve 243a which is an open/close valve, and a later-described porous nozzle 233 disposed in the processing furnace 202. Reaction gas (TMA) is supplied from the second gas supply tubes 232b into the processing furnace 202 through a second mass flow controller 241b which is flow rate control means, a second valve 252 which is an open/close valve, a TMA container 260, a third valve 250 which is an open/close valve, and the porous nozzle 233. A heater 300 is provided in the gas supply tube 232b at a location between the TMA container 260 and the manifold 209, and the temperature of the gas supply tube 232b is maintained at 50 to 60° C.

An inert gas line 232c is connected to the gas supply tube 232h downstream of the third valve 250 through an open/close valve 253. An inert gas line 232d is connected to the gas supply tube 232a downstream of the first valve 243a through an open/close valve 254.

The processing furnace 202 is connected to a vacuum pump 246 which is exhausting means through a fourth valve 243d by a gas exhausting tube 231 which is an exhausting tube for exhausting gas so as to evacuate the processing furnace 202. The fourth valve 243d is the open/close valve which can open and close the valve to evacuate the processing furnace 202 and to stop the evacuation, and can adjust the pressure by adjusting the valve opening.

The nozzle 233 is disposed such as to extend from a lower portion to an upper portion of the reaction tube 203 along the stacking direction of the wafers 200. The nozzle 233 is provided with gas supply holes 248b through which a plurality of eases are supplied.

The boat 217 is provided at a central portion in the reaction tube 203. The plurality of wafers 200 are stacked on the boat 217. The wafers 200 are stacked at the same distances from one another. The boat 217 can come into and out from the reaction tube 203 by a boat elevator mechanism (not shown). To enhance the consistency of processing, a boat rotating mechanism 267 which is rotating means for rotating the boat 217 is provided. By rotating the boat rotating mechanism 267, the boat 217 held by the quartz cap 218 is rotated.

A controller 121 which is control means controls the first and second mass flow controllers 241a and 241b, the first to fourth valves 243a. 252, 250 and 243d, the valves 253 and 254, the heater 207, the vacuum pump 246, the boat rotating mechanism 267, and adjustment of flow rates of the first and second mass flow controllers 241a and 241h connected to the boat elevator mechanism (not shown), opening and closing operations of the first to third valves 243a, 252, 250 and valves 253 and 254, opening and closing operations and adjustment of pressure of the fourth valve 243d, adjustment of the temperature of the heater 207, actuation and stop of the vacuum pump 246, adjustment of rotation speed of the boat rotating mechanism 267, and vertical movement of the boat elevator mechanism.

Next, examples of forming operation of $Al_2O_3$ films using TMA and $O_3$ will be explained.

First, semiconductor silicon wafers 200 on which films are to be formed are loaded on the boat 217, and the boat 217 is transferred into the processing furnace 202. After the transfer, the following three steps are carried out in succession.

[Step 1]

In step 1. $O_3$ gas is allowed to flow. First, the first valve 243a provided in the first gas supply tube 232a and the fourth valve 243d provided in the gas exhausting tube 231 are opened, and gas is exhausted from the gas exhausting tube 231 while supplying $O_3$ gas whose flow rate is adjusted by the first valve 243a from the first gas supply tube 232a into the processing furnace 202 through the gas supply holes 248b of the nozzle 233 and in this state. When $O_3$ gas is allowed to flow, the fourth valve 243d is appropriately adjusted, and the pressure in the processing furnace 202 is set to 10 to 100 Pa. A supply flow rate of $O_3$ controlled by the first mass flow controller 241a is 1000 to 10000 sccm. The wafers 200 are exposed to $O_3$ for 2 to 120 seconds. The temperature of the heater 207 at that time is set such that the temperature of the wafers becomes 250 to 450° C.

At the same time, if the open/close valve 253 is opened and inert gas is allowed to flow from the inert gas line 232c which is connected to an intermediate portion of the gas supply tube 232b, it is possible to prevent $O_3$ gas from flowing toward TMA.

At that time, the gas flowing into the processing furnace 202 is $O_3$ and only inert gas such as $N_2$ and Ar, and there exists no TMA. Therefore. $O_3$ does not cause the vapor-phase reaction, and surface-reacts with a ground film on the wafer 200.

[Step 2]

In step 2, the first valve 243a of the first gas supply tube 232a is closed to stop the supply of $O_3$. The fourth value 243d gas exhausting tube 231 is held opened, the processing furnace 202 is evacuated by the vacuum pump 246 to a pressure equal to or lower than 20 Pa, and remaining $O_3$ is exhausted from the processing furnace 202. At that time, inert gas such as $N_2$ is supplied into the processing furnace 202 from the first gas supply tube 232a which is an $O_3$ supply line and from the second gas supply tubes 232b which is a TMA supply line, the evacuating effect of remaining $O_3$ is further enhanced.

[Step 3]

In step 3, TMA gas is allowed to flow. Here, TMA is liquid at the normal temperature. To supply TMA to the processing furnace 202, there are a method in which TMA is heated and evaporated and then is supplied to the processing furnace 202, and a method in which inert gas called carrier gas such as nitrogen gas and rare gas is allowed to flow into the TMA container 260, and evaporated TMA is supplied to the processing furnace together with the carrier gas. Among them, the later method will be explained. First, all of a valve 252 provided in a carrier gas supply tube 232b, a valve 250 provided between the TMA container 260 and the processing furnace 202 and the fourth valve 243d provided in the gas exhausting tube 231 are opened, carrier gas whose flow rate is adjusted by the second mass flow controller 241b is allowed to flow through the TMA container 260 from the carrier gas supply tube 232h, and mixture gas of TMA and carrier gas is supplied to the processing furnace 202 from the gas supply holes 248b and in this state, gas is exhausted from the gas exhausting tube 231. When TMA gas is allowed to flow, the fourth valve 243d is appropriately adjusted and the pressure in the processing furnace 202 is set to 10 to 900 Pa. The supply flow rate of carrier gas controlled by the second mass flow controller 241a is 10000 scent or less. The time during which TMA is supplied is set to 1 to 4 seconds. The time during which wafers are exposed to higher pressure atmosphere to further adsorb may be set to 0 to 4 seconds. The temperature of the wafer at that time is 250 to 450° C. like the case in which $O_3$ is supplied. By supplying TMA. $O_3$ of the ground film and TMA surface react with each other, and $Al_2O_3$ film is formed on the wafer 200.

At the same time, if the open/close valve 254 is opened and inert gas is allowed to flow from the inert gas line 232d which is connected to an intermediate portion of the gas supply tube 232a, it is possible to prevent TMA gas from flowing toward $O_3$ side.

After films are formed, the valve 250 is closed, the fourth valve 243d is opened, the processing furnace 202 is evacuated, and remaining gas which contributed to the formation of TMA films is exhausted. At that time, if inert gas such as $N_2$ is supplied into the processing furnace 202 from the first gas supply tube 232a which is the $O_3$ supply line and from the second gas supply tubes 232b which is the TMA supply line, the exhausting effect of remaining gas after the gas contributed to the formation of TMA films from the processing furnace 202 is enhanced.

If the steps 1 to 3 are defined as one cycle, $Al_2O_3$ films having predetermined thickness can be formed on the wafers 200 by repeating this cycle a plurality of times.

The processing furnace 202 is evacuated to remove $O_3$ gas and then TMA is allowed to flow. Therefore, $O_3$ gas and TMA do not react with each other on the way to the wafers 200. The supplied TMA can effectively react only with $O_3$ which is adsorbed to the wafers 200.

The first gas supply tube 232a which is the $O_3$ supply line and from the second gas supply tubes 232b which is the TMA supply line merge with each other in the processing furnace 202. With this, TMA and $O_3$ can be adsorbed and can react with each other alternately even in the nozzle 233, thereby forming $Al_2O_3$ deposition films, and it is possible to avoid such a problem that Al film that can be a foreign matter generation source in the TMA nozzle when TMA and $O_3$ are supplied through independent nozzles. The $Al_2O_3$ film has more excellent adhesion as compared with Al film, and the $Al_2O_3$ film is less probe to be peeled off and thus, $Al_2O_3$ film is less prone to be the foreign matter generation source.

Figure 4:
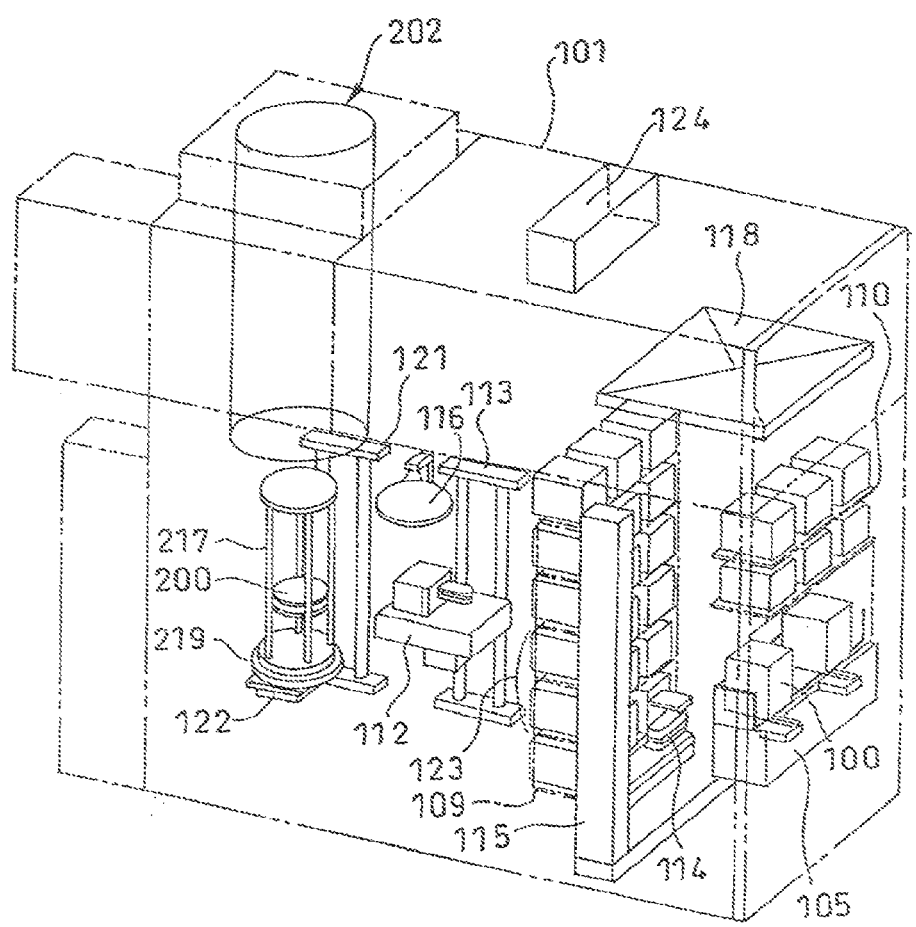
FIG. 4 is a schematic perspective view for explaining the substrate processing apparatus according to the one embodiment of the present invention.

Next, referring to FIG. 4, an outline of the semiconductor producing apparatus which is one example of the semiconductor producing apparatus to which the present invention is preferably applied will be explained.

A cassette stage 105 as a holding tool delivery member which deliveries a cassette 100 as a substrate accommodating container between a casing 101 and an external transfer apparatus (not shown) is provided on a front surface side in the casing 101. A cassette elevator 115 as elevator means is provided on a rear side of the cassette stage 105. A cassette loader 114 as transfer means is mounted on the cassette elevator 115. A cassette shelf 109 as placing means of the cassette 100 is provided on the rear side of the cassette elevator 115, and an auxiliary cassette shelf 110 is provided also above the cassette stage 105. A clean unit 118 is provided above the auxiliary cassette shelf 110 so that clean air can flow into the casing 101.

The processing furnace 202 is provided above a rear portion of the casing 101. A boat elevator 121 as elevator means is provided below the processing furnace 202. The boat elevator 121 vertically moves the boat 217 as the substrate holding means to and from the processing furnace 202. The boat 217 holds the wafers 200 as substrates in the multi-stacked manner in their horizontal attitudes. The seal cap 219 as a lid is mounted on a tip end of a vertically moving member 122 which is mounted on the boat elevator 121, and the seal cap 219 vertically supports the boat 217. A loading elevator 113 as elevator means is provided between the boat elevator 121 and the cassette shelf 109. A wafer loader 112 as transfer means is mounted on the loading elevator 113. A furnace opening shutter 116 as a shielding member is provided by the side of the boat elevator 121. The furnace opening shutter 116 has an opening/closing mechanism and closes a lower surface of the processing furnace 202.

The cassette 100 in which the wafers 200 are rotated through 90a by the cassette stage 105 such that wafers 200 are brought into the cassette stage 105 from an external transfer apparatus (not shown) and the wafers 200 assume the horizontal attitudes. The cassette 100 is transferred to the cassette shelf 109 or the auxiliary cassette shelf 110 from the cassette stage 105 by cooperation of vertical movement and lateral movement of the cassette elevator 115 and forward and backward movement and rotational movement of the cassette loader 114.

The cassette shelf 109 includes a transfer shelf 123 in which cassette 100 to be transferred by the wafer loader 112 is accommodated. The cassette 100 on which the wafers 200 are set is transferred to the transfer shelf 123 by the cassette elevator 115 and the cassette loader 114.

If the cassette 100 is transferred to the transfer shelf 123, the wafers 200 are loaded on the boat 217 which is lowered from the transfer shelf 123 by cooperation of forward and backward motion and rotational motion of the wafer loader 112 and vertical motion of the loading elevator 113.

If a necessary number of wafers 200 are loaded on the boat 217, the boat 217 is inserted into the processing furnace 202 by the boat elevator 121, and the processing furnace 202 is air-tightly closed with the seal cap 219. In the air-tightly closed processing furnace 202, the wafers 200 are heated, processing gas is supplied into the processing furnace 202, and the wafers 200 are processed.

If the processing of the wafers 200 is completed, the wafers 200 are moved to the cassette 100 of the transfer shell 123 from the boat 217 following the above procedure in reverse, the cassette 100 is moved to the cassette stage 105 from the transfer shelf 123 by the cassette loader 114, and is transferred out from the casing 101 by the external transfer apparatus (not shown). In the state in which the boat 217 is lowered, the furnace opening shutter 116 closes the lower surface of the processing furnace 202, to prevent outside air from entering into the processing furnace 202.

The transfer motions of the cassette loader 114 and the like are controlled by transfer control means 124.

The entire disclosure of Japanese Patent Application No. 2003-293953 filed on Aug. 15, 2003 including specification, claims, drawings and abstract are incorporated herein by reference in its entirety.

INDUSTRIAL APPLICABILITY

As explained above, according to the embodiment of the present invention, it becomes possible to form $Al_2O_5$ films by the ALD method using the batch type processing apparatus which has excellent mass productivity, and to suppress the formation of films such as Al films in the nozzle which is by-product.

As a result, the present invention can be preferably utilized especially for a substrate processing apparatus which processes a semiconductor wafer, and for a device producing method using the substrate processing apparatus.

The invention claimed is:
1. A producing method of a semiconductor device, comprising:
    transferring a plurality of substrates into a processing chamber that includes:
        a connection portion where a first gas supply tube and a second gas supply tube merge with each other,
        a gas supply member which is connected downstream of the connection portion, said downstream direction being defined along the flow of gas into the processing chamber, the gas supply member including a plurality of gas supply holes, and a substrate holding section configured to hold a plurality of substrates;

adjusting a temperature of the connection portion to a temperature at which a second gas is not decomposed, and adjusting a temperature of a portion of the gas supply member at least including the plurality of gas supply holes, to a temperature at which the second gas is decomposed; and after adjusting said temperatures, supplying gas by repeating the following steps of (a) supplying a first gas and (b) supplying a second gas, said step (a) being a step of supplying a first gas into the processing chamber from a first gas supply source through the first gas supply tube, the connection portion, and the gas supply member, and said step (b) being a step of supplying a second gas into the processing chamber from a second gas supply source through the second gas supply tube, the connection portion, and the gas supply member, to deposit a product stemming from a reaction between the first gas and the second gas on surfaces of the substrates and on an inner wall of the gas supply member.

2. The producing method of a semiconductor device as recited in claim 1, wherein a path between the first gas supply source and the gas supply member is in communication while a path between the second gas supply source and the gas supply member is closed in the first gas supplying step; and a path between the second gas supply source and the gas supply member is in communication while a path between the first gas supply source and the gas supply member is closed in the second gas supplying step.

3. The producing method of a semiconductor device as recited in claim 2, further comprising the following steps of:

after supplying the gas:

transferring the plurality of substrates out from the processing chamber; and supplying a cleaning gas into the processing chamber through the gas supply member, thereby performing cleaning of the processing chamber and removing a film formed on the gas supply member.

4. The producing method of a semiconductor device as recited in claim 2, wherein adhesion, to the gas supply member, of the second gas at a temperature equal to or higher than a decomposition temperature of the second gas, is lower than adhesion, to the gas supply member, of matter which is generated from a reaction between the first gas and the second gas.

5. The producing method of a semiconductor device as recited in claim 4, further comprising the following steps of:

after supplying the gas:

transferring the plurality of substrates out from the processing chamber; and supplying a cleaning gas into the processing chamber through the gas supply member, thereby performing cleaning of the processing chamber and removing a the-film formed on the gas supply member.

6. The producing method of a semiconductor device as recited in claim 1, further comprising the following steps of:

after supplying the gas:

transferring the plurality of substrates out from the processing chamber; and supplying a cleaning gas into the processing chamber through the gas supply member, thereby performing cleaning of the processing chamber and removing a film formed on the gas supply member.

7. The producing method of a semiconductor device as recited in claim 1, wherein adhesion, to the gas supply member, of the second gas at a temperature equal to or higher than a decomposition temperature of the second gas, is lower than adhesion, to the gas supply member, of matter which is generated from a reaction between the first gas and the second gas.

8. The producing method of a semiconductor device as recited in claim 7, further comprising the following steps of:

after supplying the gas:

transferring the plurality of substrates out from the processing chamber; and supplying a cleaning gas into the processing chamber through the gas supply member, thereby performing cleaning of the processing chamber and removing a film formed on the gas supply member.

9. The producing method of a semiconductor device as recited in claim 1, wherein the product has an adhesion property which prevents the product from peeling off from the inner wall of the gas supply member.

* * * * *